US008013979B2

(12) United States Patent
Ryzhikov et al.

(10) Patent No.: US 8,013,979 B2
(45) Date of Patent: Sep. 6, 2011

(54) ILLUMINATION SYSTEM WITH LOW TELECENTRICITY ERROR AND DYNAMIC TELECENTRICITY CORRECTION

(75) Inventors: Lev Ryzhikov, Norwalk, CT (US); James Tsacoyeanes, Southbury, CT (US); Roberto B. Wiener, Ridgefield, CT (US); Scott D. Coston, New Milford, CT (US)

(73) Assignee: ASML Holding N.V., Veldhoven (NL)

( * ) Notice: Subject to any disclaimer, the term of this patent is extended or adjusted under 35 U.S.C. 154(b) by 599 days.

(21) Appl. No.: 11/933,894

(22) Filed: Nov. 1, 2007

(65) Prior Publication Data

US 2009/0046373 A1 Feb. 19, 2009

Related U.S. Application Data

(63) Continuation-in-part of application No. 11/840,821, filed on Aug. 17, 2007.

(51) Int. Cl.
*G03B 27/54* (2006.01)
*G03B 27/42* (2006.01)
(52) U.S. Cl. .......................................... 355/67; 355/53
(58) Field of Classification Search .................... 355/53, 355/67
See application file for complete search history.

(56) References Cited

U.S. PATENT DOCUMENTS

| 6,081,320 A | 6/2000 | Tanitsu |
| 6,100,961 A | 8/2000 | Shiraishi et al. |
| 2003/0164933 A1* | 9/2003 | Nishi et al. ..................... 355/67 |
| 2005/0078292 A1 | 4/2005 | Bruebach |
| 2005/0270510 A1 | 12/2005 | Botma |
| 2006/0158615 A1* | 7/2006 | Williamson .................... 353/37 |
| 2008/0088814 A1* | 4/2008 | Kajiyama et al. ............... 355/71 |
| 2009/0046338 A1 | 2/2009 | Zimmerman et al. |

OTHER PUBLICATIONS

Non-Final Rejection mailed Aug. 3, 2010 for U.S. Appl. No. 11/840,821, 11 pgs.
Zimmerman et al., U.S. Office Action Final Rejection directed to co-pending U.S. Appl. No. 11/840,821, filed Aug. 17, 2007, mailed Jan. 6, 2011; 12 pages.
U.S. Non Final Office Action dated Apr. 27, 2011, directed to related U.S. Appl. No. 11/840,821, filed Aug. 17, 2007; 11 pages.

* cited by examiner

*Primary Examiner* — Peter B Kim
(74) *Attorney, Agent, or Firm* — Sterne, Kessler, Goldstein & Fox P.L.L.C

(57) ABSTRACT

An illuminator with substantially reduced telecentricity error relative to conventional illuminators includes one or more modules having movable optical elements with low telecentricity error that may be adjusted to compensate for telecentricity errors. The modules may include a zoom zoom axicon, a condenser, and a multi field relay. The zoom zoom axicon may include one or more lenses adjustable in up to six degrees of freedom. The condenser and the multi field relay may include one or more lenses adjustable in up to six degrees of freedom or a set of two or more mirrors with one or more of the mirrors adjustable in up to six degrees of freedom. The illuminator may also include a control system to control the adjustments of the movable optical elements. A lithography system including such an illuminator is also presented, along with a method of providing illumination with low telecentricity error.

25 Claims, 13 Drawing Sheets

(VIEW 1)                    (VIEW 2)

1000

ILLUMINATION SYSTEM WITH LOW TELECENTRICITY ERROR AND DYNAMIC TELECENTRICITY CORRECTION

CROSS-REFERENCE TO RELATED APPLICATIONS

This application is a Continuation-In-Part of U.S. patent application Ser. No. 11/840,821, filed Aug. 17, 2007, which is incorporated herein by reference in its entirety.

BACKGROUND

1. Field of the Invention

The present invention is directed generally to optics. More particularly, the present invention relates to optics used in a lithography system.

2. Related Art

A lithographic apparatus is a machine that applies a desired pattern onto a substrate or part of a substrate. A lithographic apparatus may be used, for example, in the manufacture of flat panel displays, integrated circuits (ICs) and other devices involving fine structures. In a conventional apparatus, light is directed from an illumination system to a patterning device, which may be referred to as a mask, a reticle, an array of individually programmable or controllable elements (maskless), or the like. The patterning device may be used to generate a circuit pattern corresponding to an individual layer of an IC, flat panel display, or other device. This pattern may be transferred onto all or part of the substrate (e.g., a glass plate, a wafer, etc.), by imaging onto a layer of radiation-sensitive material (e.g., resist) provided on the substrate. The imaging may include the processing of light through a projection system, which may include optical components such as mirrors, lenses, beam splitters, and the like. Other components or devices may exist in a lithographic apparatus that may also contain optical components.

Illumination systems in conventional lithographic tools can have relatively high telecentricity error (i.e., beam pointing error) (e.g., on the order of several milliradians). This illumination telecentricity error is magnified at the wafer plane by a 4× (typical) magnification projection optics. Projection optics of maskless systems may have much larger magnifications (e.g., on the order of 267×-400×). For these systems, it would be beneficial for illumination systems to have telecentricity errors 100 times smaller than the magnification of the illumination systems for conventional systems.

BRIEF SUMMARY

What is needed is an illumination system that may handle much larger magnifications with low telecentricity error.

In an embodiment, an illuminator with reduced telecentricity error relative to conventional illuminators includes one or more modules having one or more movable optical elements for telecentricity correction. The one or more modules have low telecentricity error and are configured to be adjusted to compensate for telecentricity errors as a light beam passes through them. In one example, the one or more modules include a zoom zoom axicon, a condenser, and a multi field relay. The zoom zoom axicon may include one or more lenses that are configured to be adjusted in up to six degrees of freedom. The condenser and the multi field relay may include one or more lenses that are configured to be adjusted in up to six degrees of freedom or a set of two or more mirrors with one or more mirrors configured to be adjusted in up to six degrees of freedom.

In one example, the illuminator may include a control system that is configured to control the positioning of the one or more movable optical elements of the one or more modules to maintain low telecentricity error. The control system may include beam splitters configured to split beams of radiation from corresponding ones of one or more of the one or more modules into first and second portions. The control system may also include a sensor configured to receive respective first portions of respective ones of the split beams of radiation, and a controller, coupled to the sensor and the one or more modules, and configured to control the positioning of movable components of respective ones of the one or more modules based on signals received from the sensor.

In an embodiment, a lithography system includes a source of radiation configured to emit a beam of radiation, an illuminator configured to process the beam of radiation, a patterning device configured to pattern the processed beam of radiation, and a projection system configured to project the patterned beam of radiation onto a target portion of a substrate. The illuminator includes one or more modules having one or more movable optical elements for telecentricity correction, where the one or more modules have low telecentricity error and are configured to be adjusted to compensate for telecentricity errors.

In an example, the lithography system may also include a beam delivery system configured to receive the beam of radiation from the source of radiation and direct the beam of radiation to the illuminator. The lithography system may also include a control system that is configured to control the positioning of respective ones of the one or more movable optical elements of the one or more modules to maintain low telecentricity error.

In another embodiment, there is provided a method of providing illumination with low telecentricity error, which includes adjusting position of respective optical elements of one or more modules to correct telecentricity error of a received light beam before directing the light beam out of an illumination system. In an example, the adjusting position of respective optical elements includes moving the respective optical elements in up to six degrees of freedom. In one example, the adjusting step may occur during setup of a lithographic operation. In another example, the adjusting step may occur periodically during a lithographic operation. In a further example, the adjusting step may occur continuously during a lithographic operation.

In one example, the method may also include receiving the light beam at a sensor to generate a signal therefrom, receiving the signal from the sensor at a controller, and as appropriate, repeating the adjusting step based on the signal received at the controller.

In a further embodiment, a beam control system for lithographic processing includes one or more sets of one or more optical elements disposed in an optical path of a light beam. The beam control system also includes one or more sets of one or more corresponding actuators coupled to the one or more optical elements and configured to reposition respective ones of the one or more optical elements in response to one or more corresponding actuation signals. In this embodiment, the one or more sets of one or more optical elements have low telecentricity error, and the one or more sets of one or more corresponding actuators are used to adjust positions of the one or more optical elements to maintain low telecentricity error.

In one example, the beam control system includes a controller coupled to the one or more sets of one or more corresponding actuators to provide the one or more corresponding actuation signals. In a further example, the beam control system includes one or more sensors corresponding to the one or more sets of one or more optical elements. The one or more sensors are coupled to the controller and configured to detect positioning of the light beam as it leaves the one or more sets of one or more optical elements. In yet a further example, the beam control system includes a feedback loop coupled to the one or more sensors to control repositioning of at least one of the one or more sets of one or more optical elements based on one or more sensor signals, for correcting telecentricity errors during the lithographic processing.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 9A:
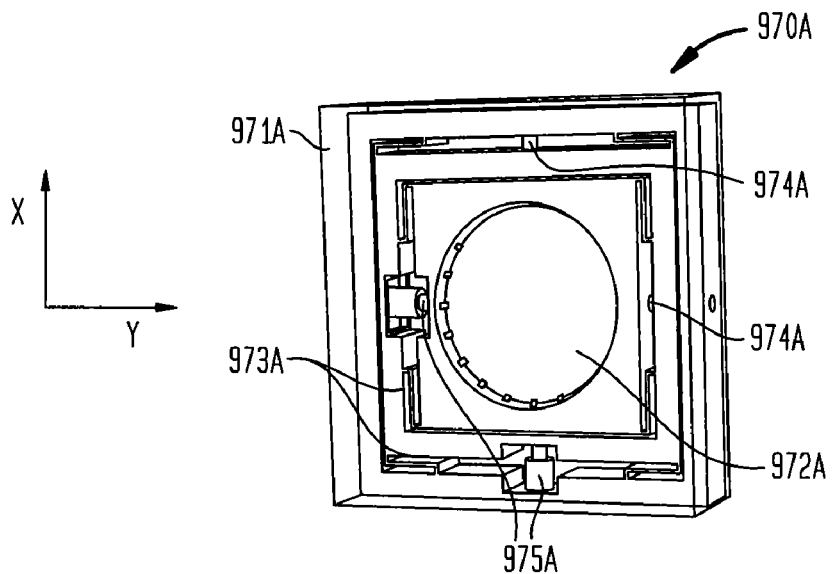
Figure 9B:
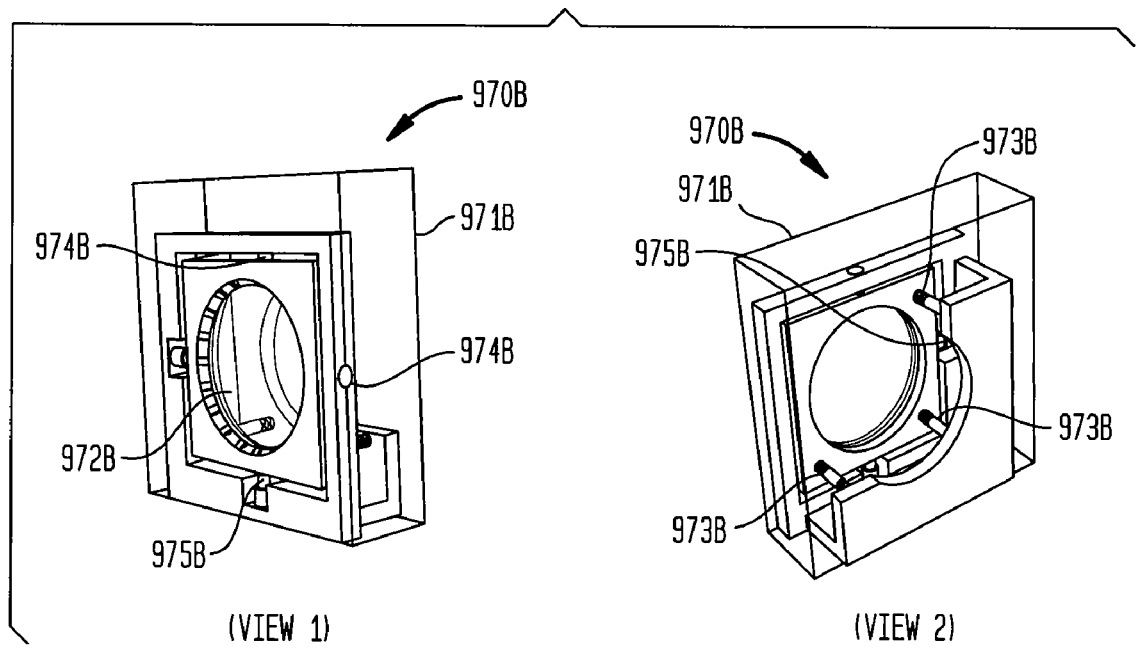

FIGS. 9A and 9B each depict a lens mounting example that includes actuators for adjusting lens position, which may be used in accordance with embodiments of the present invention.

Figure 10:
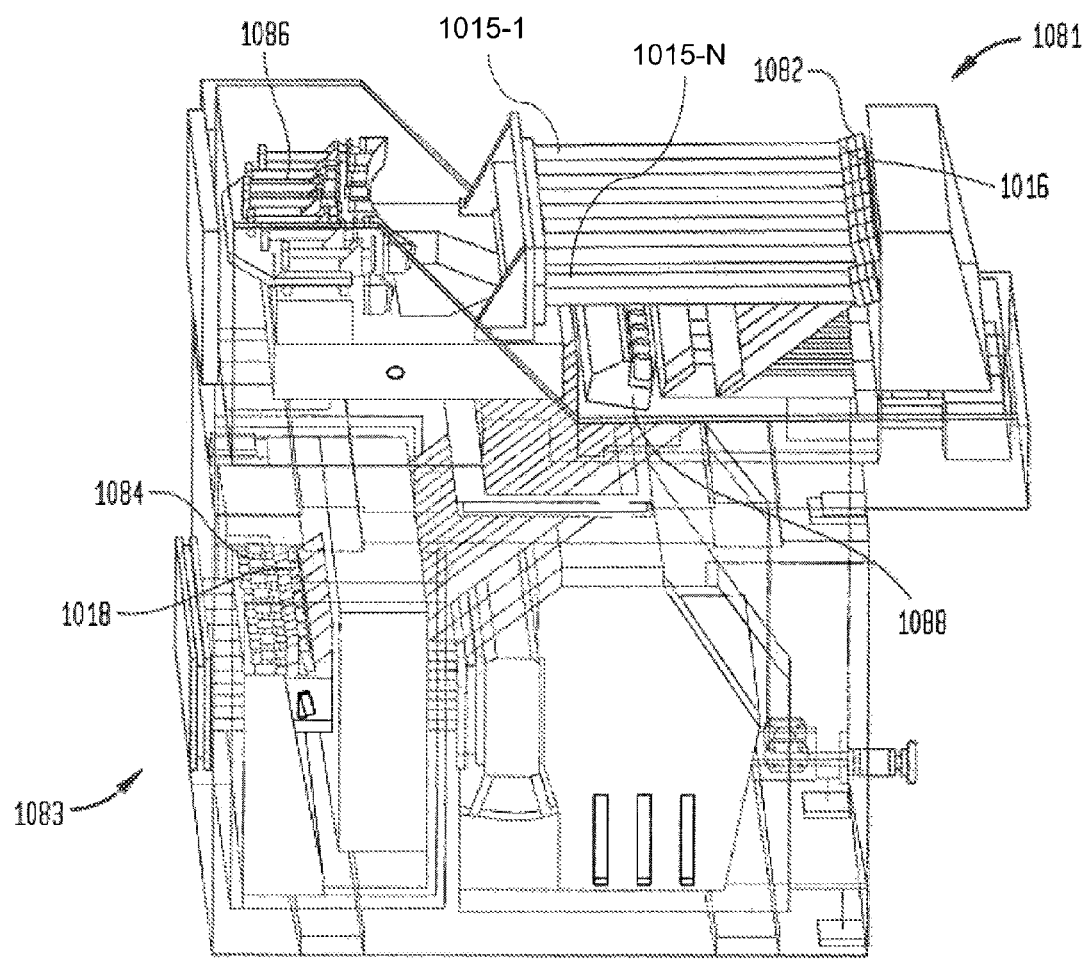

FIG. 10 depicts an example of a multi field relay module that may be used in accordance with embodiments of the present invention.

Figure 11:
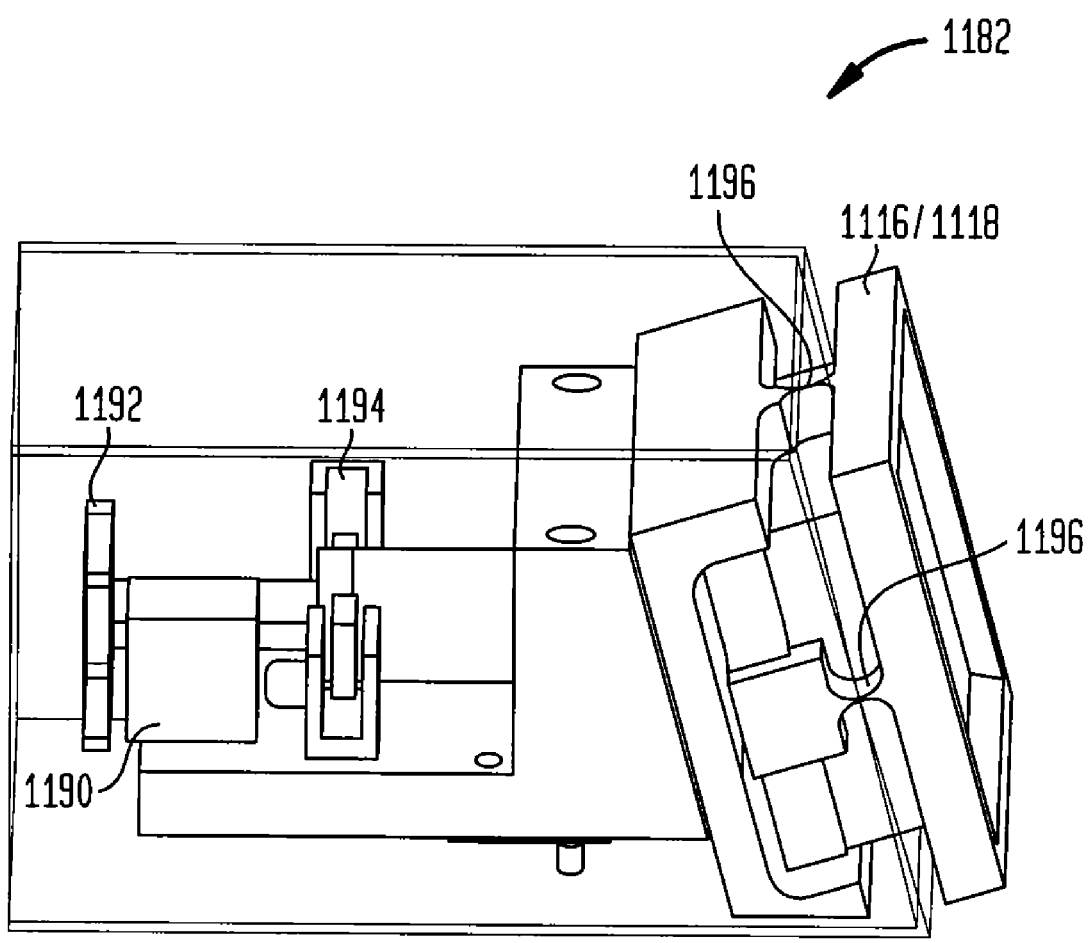
Figure 12:
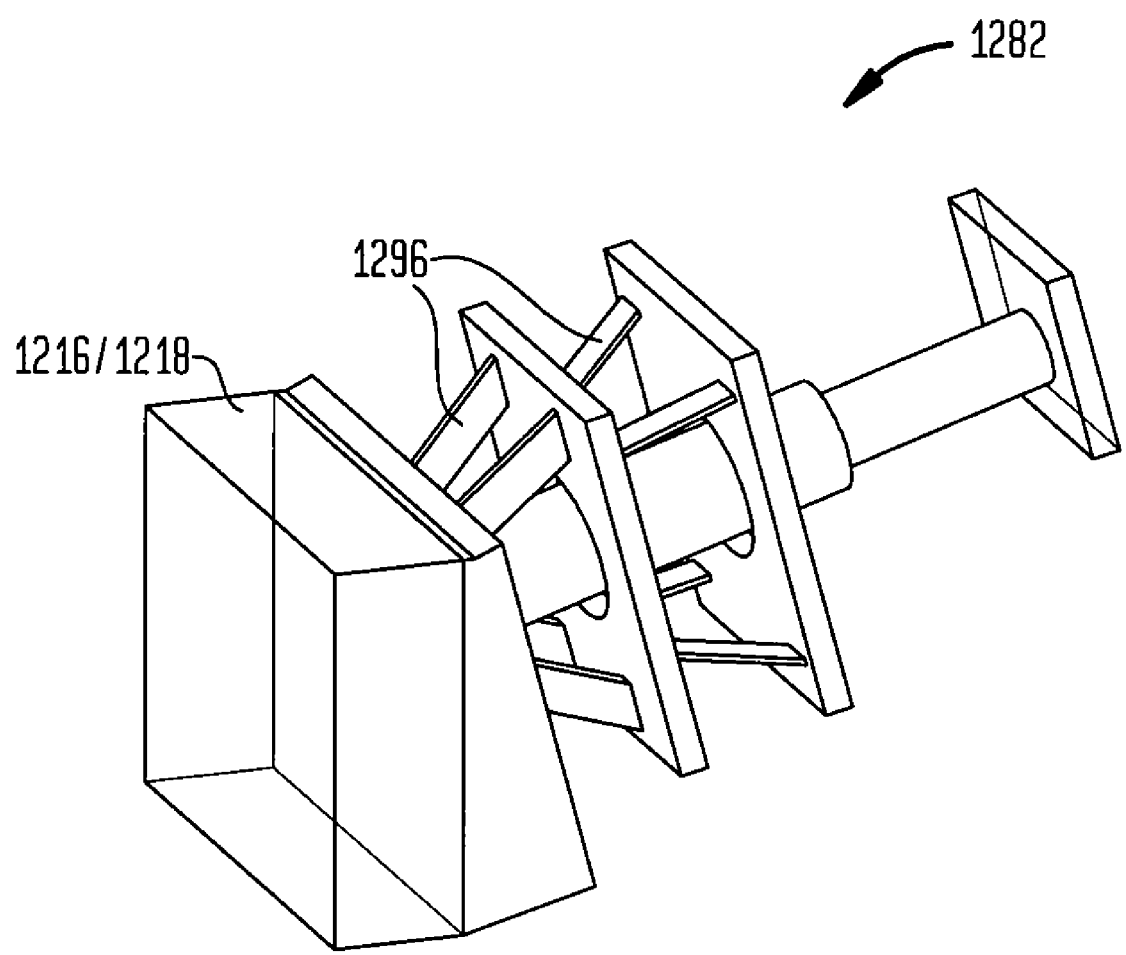
Figure 13:
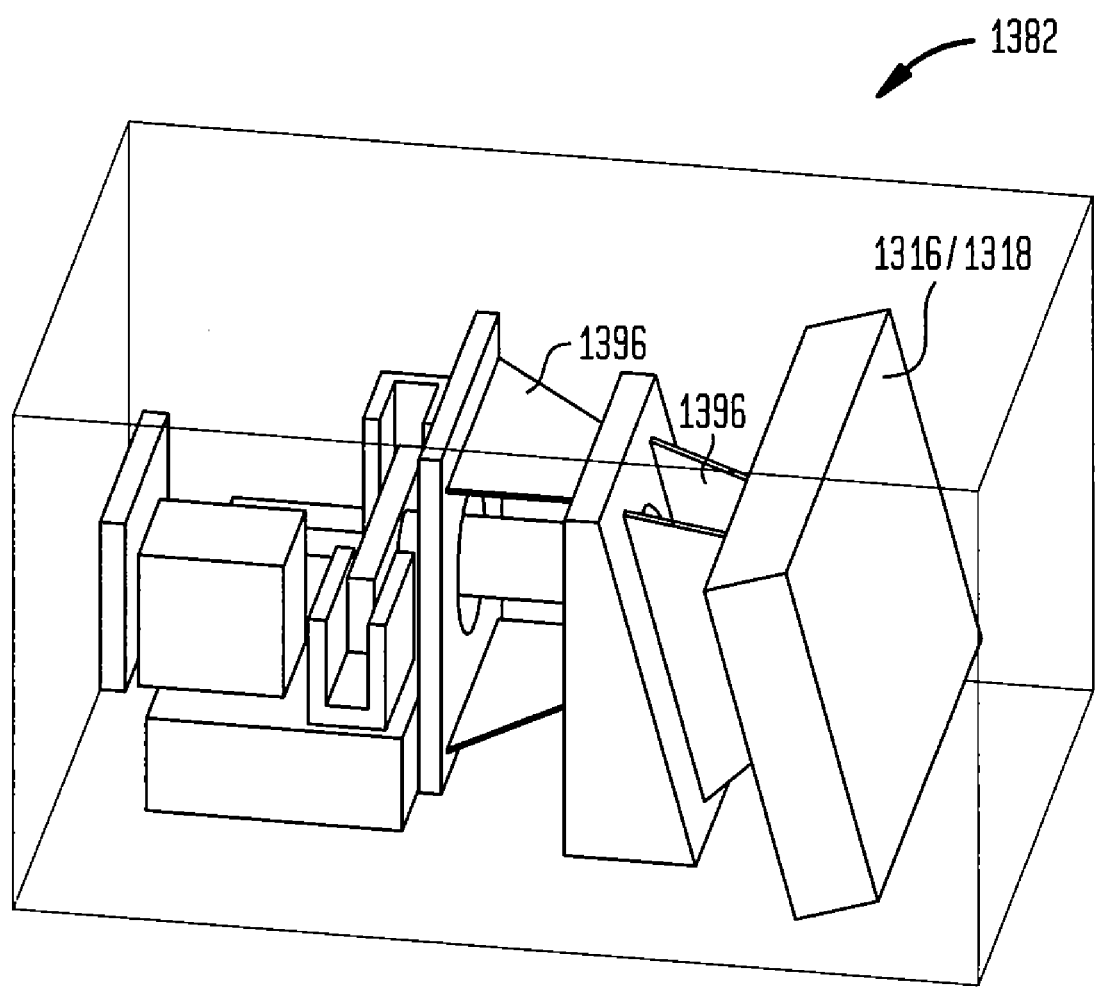

FIGS. 11, 12, and 13 each depict exemplary mirror mounting examples that may include actuators for adjusting mirror position, which may be used in accordance with embodiments of the present invention.

The present invention will be described with reference to the accompanying drawings. The drawing in which an element first appears is typically indicated by the leftmost digit(s) in the corresponding reference number.

DETAILED DESCRIPTION

While specific configurations, arrangements, and steps are discussed, it should be understood that this is done for illustrative purposes only. A person skilled in the pertinent art(s) will recognize that other configurations, arrangements, and steps may be used without departing from the spirit and scope of the present invention. It will be apparent to a person skilled in the pertinent art(s) that this invention may also be employed in a variety of other applications.

It is noted that references in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of one skilled in the art to incorporate such a feature, structure, or characteristic in connection with other embodiments whether or not explicitly described.

Figure 1:
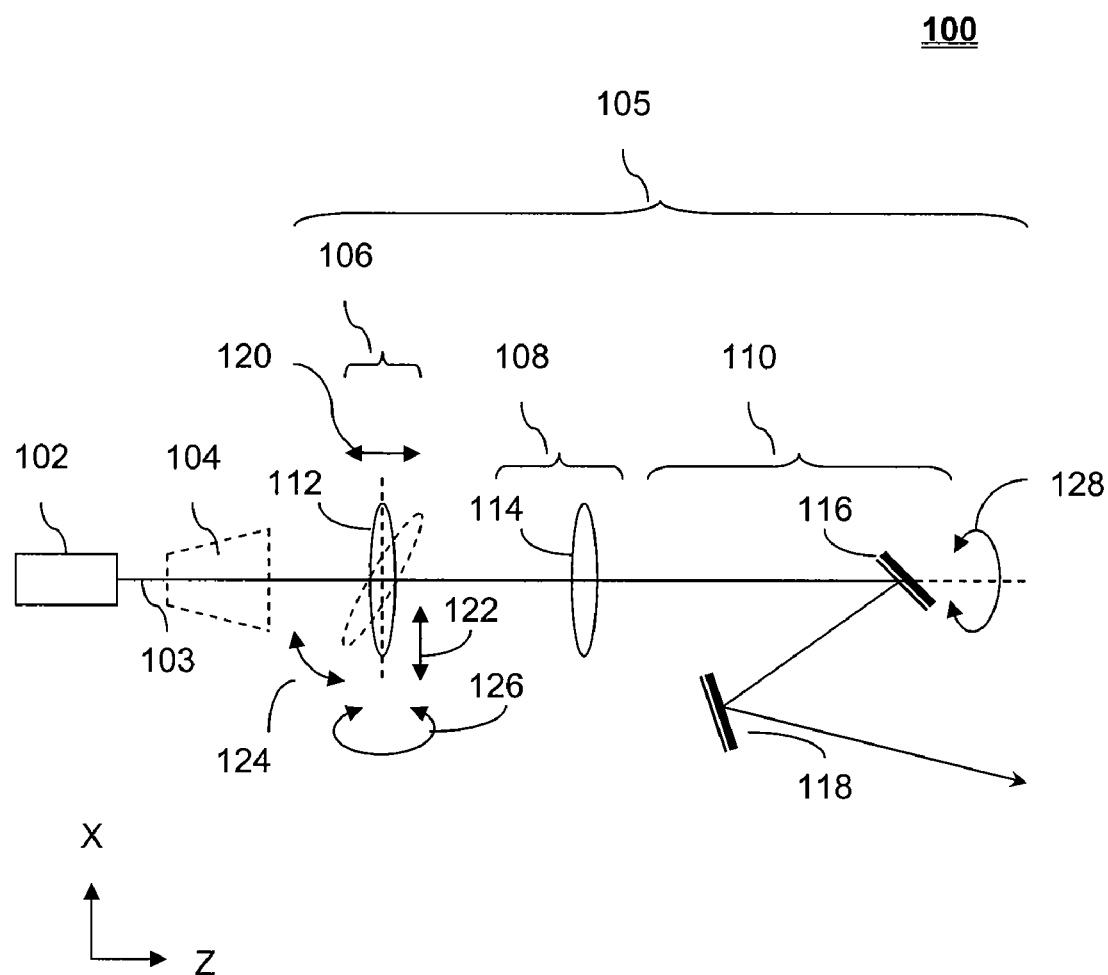
FIG. 1 is a diagram of an exemplary illumination system, according to an embodiment of the present invention.

FIG. 1 is a diagram of an exemplary radiation system 100, including an illumination system having low telecentricity error, according to an embodiment of the present invention. Radiation system 100 includes a light source 102 (e.g. a laser), optional beam delivery system 104, and illumination system (or illuminator) 105. A light beam 103 emitted from light source 102 is directed to illuminator 105 (after optional processing by beam delivery system 104) for conditioning prior to being directed to further modules of a lithography system, for example.

Illuminator 105 includes one or more modules, and may include, for example, a zoom zoom axicon module 106, a condenser module 108, and a multi field relay module 110, possibly in addition to other modules or optical components not explicitly shown. Although illuminator 105 is shown to be broken down into three modules, illuminator 105 can be considered to include any number of modules. For example, illuminator 105 as shown in FIG. 1 could be considered a single module. In the example shown in FIG. 1, illuminator 105 is considered to include three modules for ease of description only and is not limited to the three modules as shown. Further, the modules 106/108/110 of illuminator 105 may be in any order and do not have to be in the order shown in FIG. 1. Nor do modules 106/108/110 need to be in a consecutive order. Other components of an illumination system (not explicitly shown) may be placed in-between any of modules 106/108/110.

Referring to the example embodiment shown in FIG. 1, zoom zoom axicon module 106 may include a set of reflective, refractive, and/or diffractive optical elements (usually lenses and axicons) that control a pupil cell, or a range of angles that eventually strike a wafer plane, for example. In an embodiment, zoom zoom axicon module 106 includes one or more movable optical elements that compensate for telecentricity errors over an entire zoom range. Any or all of the optical elements of zoom zoom axicon module 106 may also have aspheric surfaces to provide low telecentricity error.

In the embodiment shown in FIG. 1, zoom zoom axicon module 106 includes a movable lens 112 that compensates for telecentricity errors (i.e., a telecentricity correction lens). In an example, movable lens 112 may move in up to six degrees of freedom. These include moving along a nominal optical axis (along a z-axis) as shown by arrow 120, moving within an X-Y plane perpendicular to the nominal optical axis in an X-direction shown by arrow 122 and in a Y-direction that is perpendicular to the plane of the drawing (not shown), tilting along its X-axis as shown by arrow 124, rotating along its Y-axis as shown by arrow 126, or rotating along its z-axis in a similar direction as shown by arrow 128.

Condenser module 108 may include a set of reflective, refractive, and/or diffractive optical elements (usually lenses or mirrors) that may transform position of a light beam between a pupil plane and a field plane, for example. In an embodiment, condenser module 108 includes one or more movable optical elements that compensate for telecentricity errors. Any or all of the optical elements of condenser module 108 may also have aspheric surfaces to provide low telecentricity error.

In the embodiment shown in FIG. 1, condenser module 108 includes a movable lens 114 that compensates for telecentricity errors (i.e., a telecentricity correction lens). In an example, movable lens 114 may move in up to six degrees of freedom, which may be similar to that described for movable lens 112 of zoom zoom axicon module 106.

Multi field relay module 110 may include a set of reflective, refractive, and/or diffractive optical elements (usually lenses or mirrors) that are used to direct a light beam in a desired direction, for example. In an embodiment, multi field relay module 110 includes one or more movable optical elements that compensate for telecentricity errors. Any or all of the optical elements of multi field relay module 110 may also have aspheric surfaces to provide low telecentricity error.

In the embodiment shown in FIG. 1, multi field relay module 110 includes two or more movable mirrors 116/118 that compensate for telecentricity errors (i.e., telecentricity correction mirrors). In an example, one or more of movable mirrors 116/118 may move in up to six degrees of freedom. For example, each may move in six degrees of freedom similar to that described above for movable lenses 112 and 114.

Figure 2:
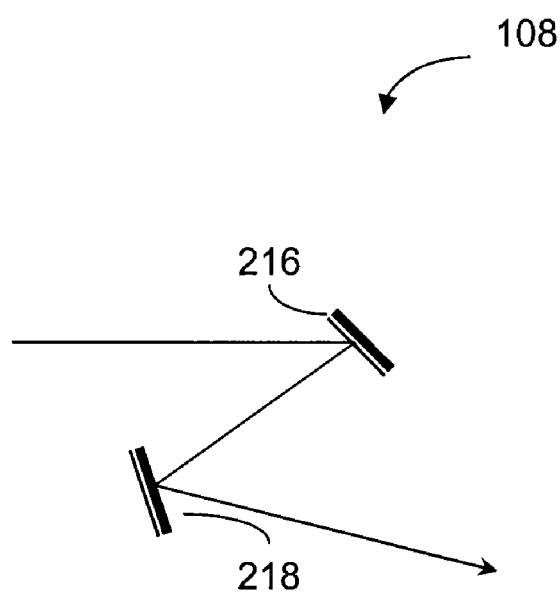
FIG. 2 depicts an example of an implementation of a module of FIG. 1.

In an alternative embodiment as shown in FIG. 2, condenser module 108 may include two or more movable mirrors 216/218 to compensate for telecentricity errors, which is an alternative arrangement to movable lens 114. One or more of movable mirrors 216/218 may move in up to six degrees of freedom, which may be similar to that described above for movable mirrors 116/118.

Figure 3:
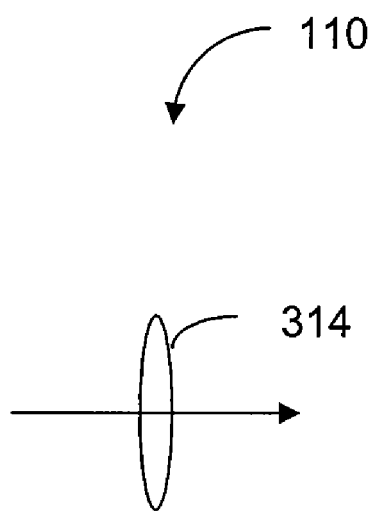
FIG. 3 depicts an example of an implementation of a module of FIG. 1.

In another alternative embodiment as shown in FIG. 3, multi field relay module 110 may include one or more lenses, such as lens 314, to compensate for telecentricity errors as an alternative to movable mirrors 116/118. Movable lens 314 may move in up to six degrees of freedom, which may be similar to that described above for movable lenses 112 and 114.

Figure 4:
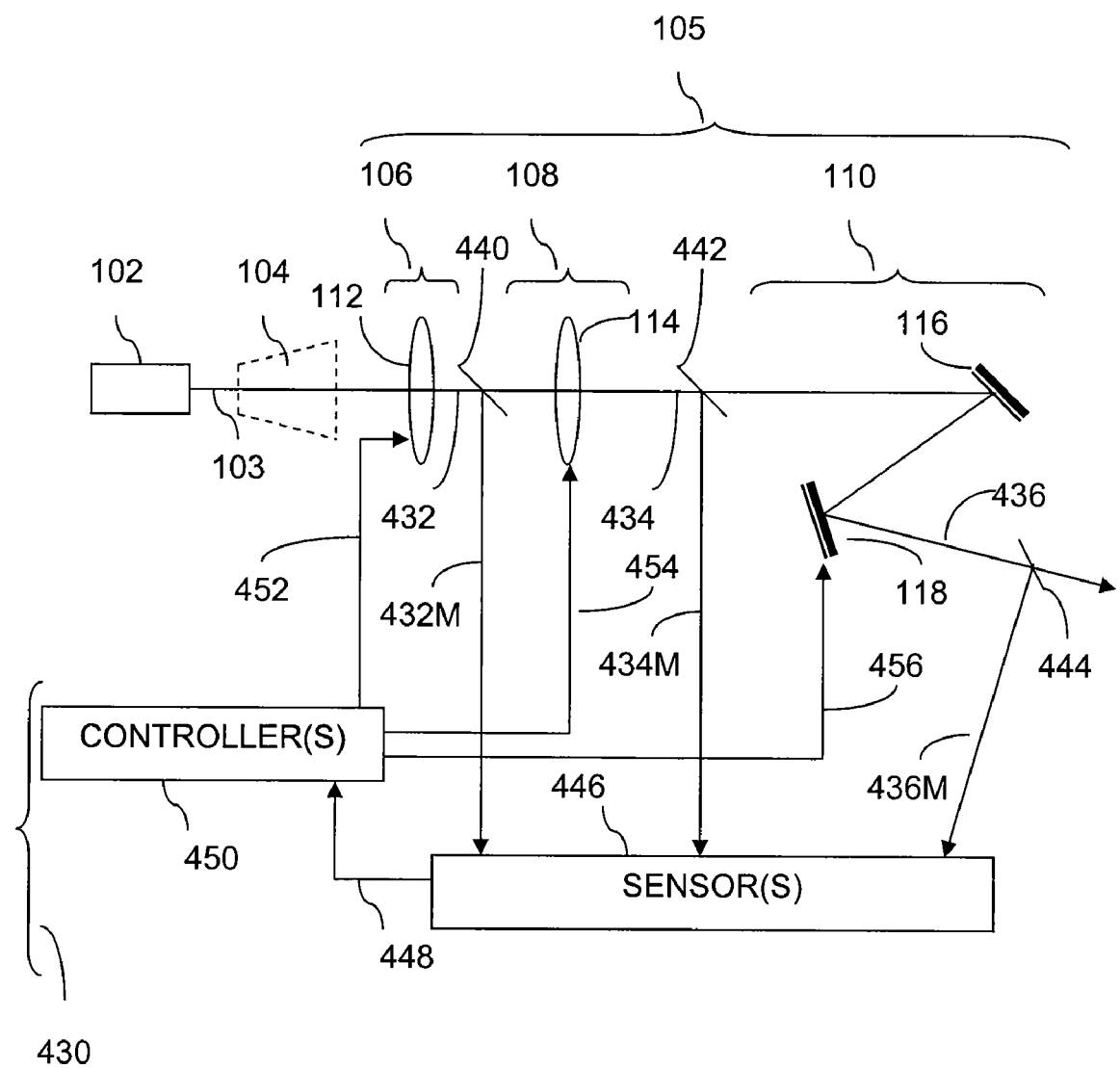
FIG. 4 is a diagram of an exemplary illumination system including a control system, according to an embodiment of the present invention.

FIG. 4 is a diagram of exemplary illumination system 105 including a control system 430 to provide telecentricity correction, according to an embodiment of the present invention. Control system 430 may include one or more sensors 446 and one or more controllers 450. In this embodiment, one or more beam splitters, such as beam splitters 440, 442, and 444, are used in various places throughout illumination system 105 to split respective beams of radiation 432, 434, and 436 after one or more of the modules 106/108/110. One or more sensors 446 receive a measuring portion 432M/434M/436M of beams 432/434/436 and generate signals or data 448 based on the sensed measuring portions 432M/434M/436M related to telecentricity (and possibly other useful information). It is to be appreciated that any number of beam splitters and/or sensors may be utilized. The number and location of beam splitters and sensors are not to be limited to what is shown in FIG. 4. The signals or data 448 generated by one or more sensors 446 are provided to one or more controllers 450. The one or more controllers 450 may use the information provided by the one or more sensors 446 to control the positioning of movable components of modules 106/108/110 (e.g., lens 112, lens 114, and/or mirrors 116/118) to compensate for telecentricity errors. Components of modules 106, 108, and 110 may be repositioned, for example, per control signals 452, 454, and 456, respectively.

Movable components of modules 106/108/110 (e.g., lens 112, lens 114, and/or mirrors 116/118) may be repositioned continuously (i.e., in real time) to correct telecentricity, during lithographic processing for example. A control system, such as that just described, may be used as a feedback loop to accomplish this dynamic adjustment. Alternatively, the repositioning of movable components of modules 106/108/110 may be done offline, or periodically, with or without a control system, during alignment, calibration, or setup of a lithographic process, for example, or at intervals during a lithographic process.

Figure 5:
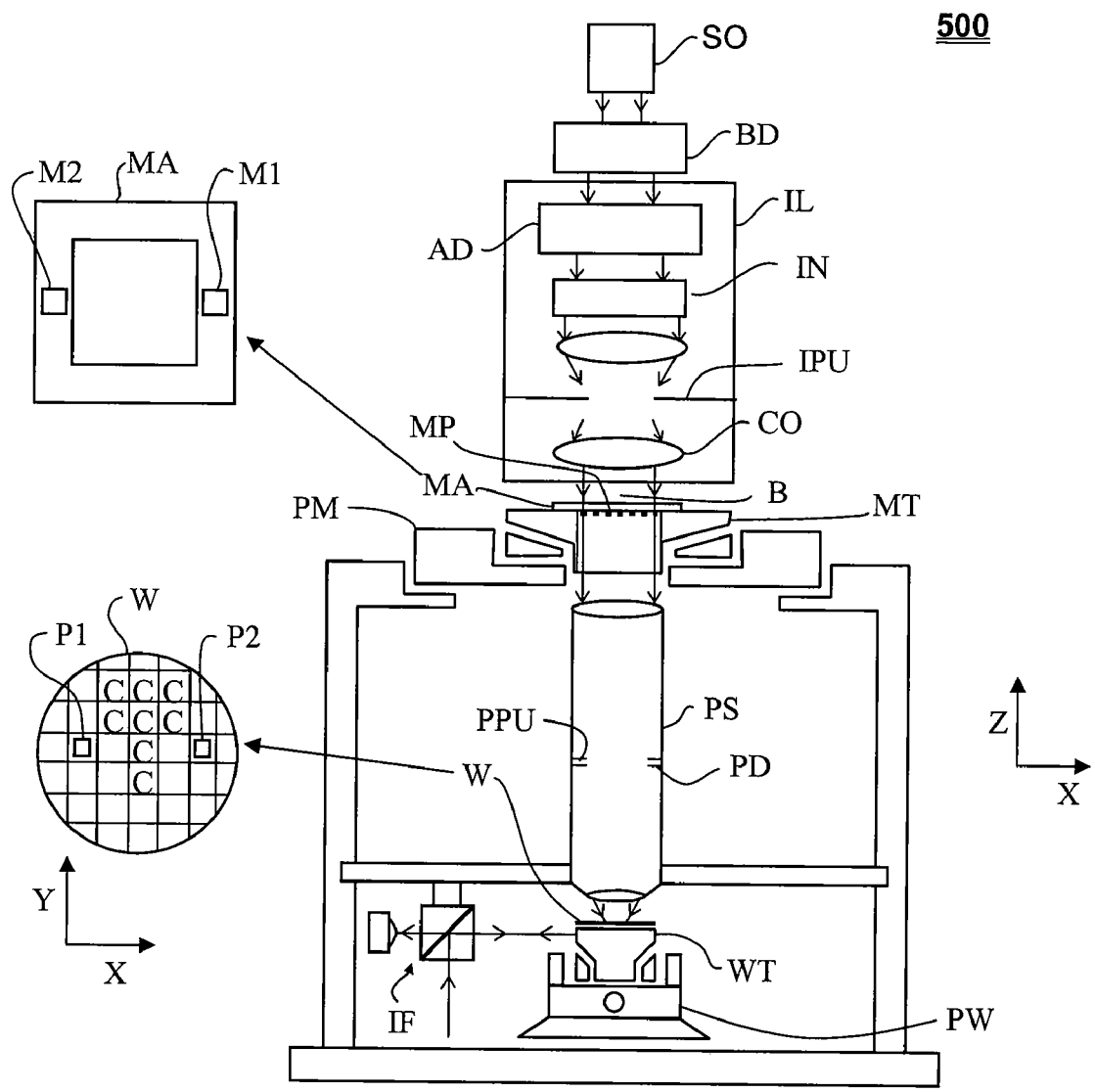
FIG. 5 depicts an exemplary lithography system, which may include an illumination system, according to embodiments of the present invention.

FIG. 5 depicts a lithographic apparatus according to an embodiment of the invention. The apparatus comprises an illumination system IL, a support structure MT, a substrate table WT, and a projection system PS.

The illumination system IL is configured to condition a radiation beam B (e.g., a beam of UV radiation as provided by a mercury arc lamp, or a beam of DUV radiation generated by a KrF excimer laser or an ArF excimer laser).

The illumination system may include various types of optical components, such as refractive, reflective, and diffractive types of optical components, or any combination thereof, for directing, shaping, or controlling radiation. The illumination system may also include telecentricity correction capability, as described above with respect to FIGS. 1-4.

The support structure (e.g., a mask table) MT is constructed to support a patterning device (e.g., a mask or dynamic patterning device) MA having a mask pattern MP and connected to a first positioner PM configured to accurately position the patterning device in accordance with certain parameters.

The substrate table (e.g., a wafer table) WT is constructed to hold a substrate (e.g., a resist-coated wafer) W and connected to a second positioner PW configured to accurately position the substrate in accordance with certain parameters.

The projection system (e.g., a refractive projection lens system) PS is configured to project a pattern imparted to the radiation beam B by the pattern MP of the patterning device MA onto a target portion C (e.g., comprising one or more dies) of the substrate W.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that may be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern MP includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, and catadioptric optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 5, the illumination system IL receives a radiation beam from a radiation source SO. The source and the lithographic apparatus may be separate entities, for example when the source is an excimer laser. In such cases, the radiation beam is passed from the source SO to the illumination system IL with the aid of a beam delivery system BD comprising, for example, suitable directing mirrors and/or a beam expander. In other cases the source may be an integral part of the lithographic apparatus, for example when the source is a mercury lamp. The source SO and the illumination system IL, together with the beam delivery system BD if required, may be referred to as a radiation system.

The illumination system IL may comprise an adjuster AD for adjusting the angular intensity distribution of the radiation beam at mask level. Generally, at least the outer and/or inner radial extent (commonly referred to as σ-outer and σ-inner, respectively) of the intensity distribution in a pupil IPU of the illumination system may be adjusted. In addition, the illumination system IL may comprise various other components, such as an integrator IN and a condenser CO. The illumination system may be used to condition the radiation beam, to have a desired uniformity and intensity distribution in its cross-section at mask level.

The radiation beam B is incident on the patterning device (e.g., mask MA or programmable patterning device), which is held on the support structure (e.g., mask table MT), and is patterned by the patterning device in accordance with a pattern MP. Having traversed the mask MA, the radiation beam B passes through the projection system PS, which focuses the beam onto a target portion C of the substrate W.

The projection system has a pupil PPU conjugate to the illumination system pupil IPU, where portions of radiation emanating from the intensity distribution at the illumination system pupil EPU and traversing a mask pattern without being affected by diffraction at a mask pattern create an image of the intensity distribution at the illumination system pupil IPU.

With the aid of the second positioner PW and position sensor IF (e.g., an interferometric device, linear encoder or capacitive sensor), the substrate table WT may be moved accurately, e.g., so as to position different target portions C in the path of the radiation beam B. Similarly, the first positioner PM and another position sensor (which is not explicitly depicted in FIG. 5) may be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C may be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation may be readily applied to maskless lithography that utilizes a programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm).

Figure 6:
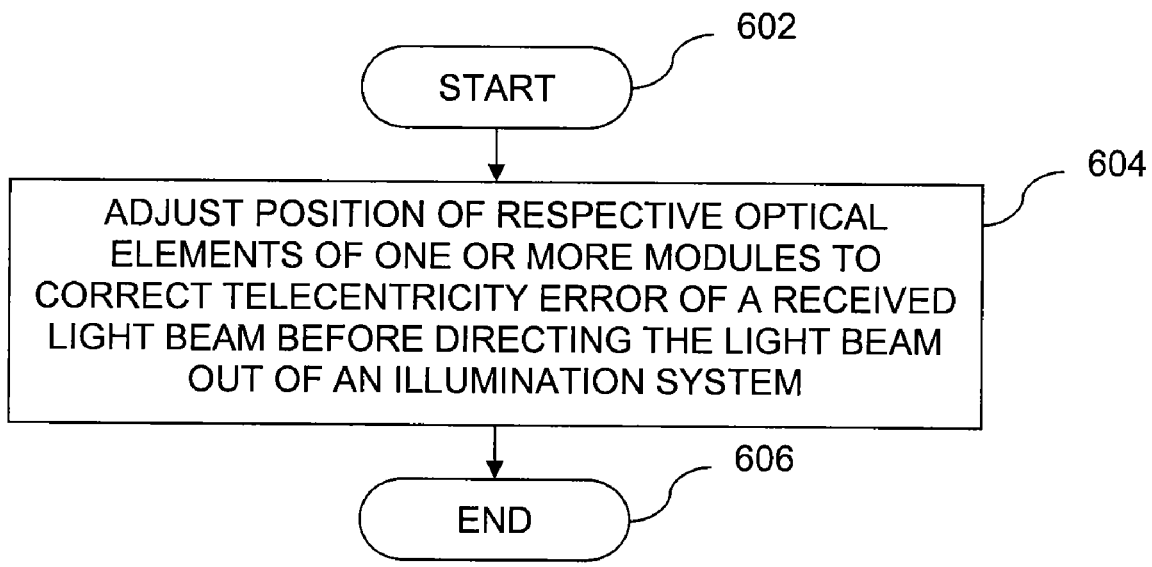
FIG. 6 is a flowchart depicting a method of providing illumination with low telecentricity error, according to an embodiment of the present invention.

FIG. 6 is a flowchart depicting a method 600 of providing illumination with low telecentricity error, according to an embodiment of the present invention. Method 600 begins at step 602 and immediately proceeds to step 604. In step 604, positions of respective optical elements of one or more modules of an illumination system are adjusted to correct telecentricity error of a received light beam before directing the light beam out of the illumination system. Method 600 ends at step 606. In an embodiment, the one or more modules of the illumination system may be a zoom zoom axicon module 106, a condenser module 108, and a multi field relay module 110, in any order, as are shown in FIG. 1. It is to be appreciated that each of the one or more modules may include one or more optical elements that do not need adjusting to correct for telecentricity error in some applications.

Figure 7:
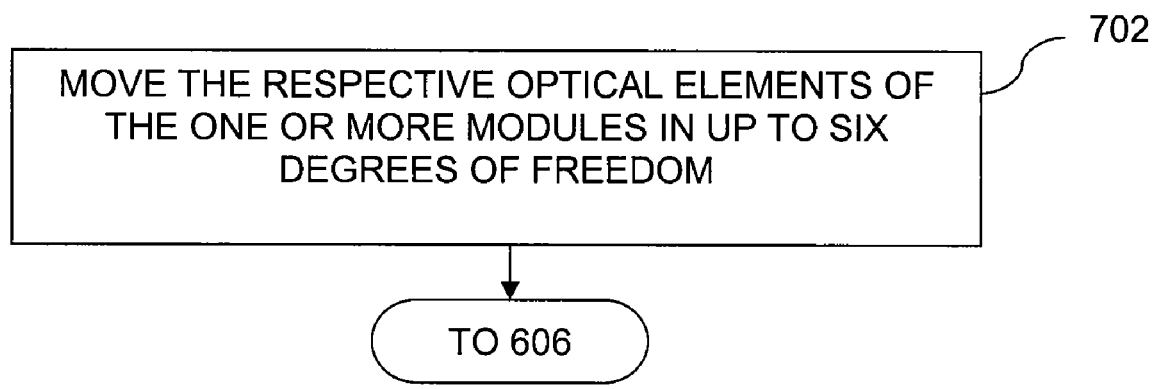
FIG. 7 is a flowchart depicting step 606 of FIG. 6, according to an embodiment of the present invention.

FIG. 7 is a flowchart depicting an exemplary embodiment of step 604 of FIG. 6. In step 702, the respective optical elements of the one or more modules are moved in up to six degrees of freedom. The method then returns to step 606. For example, if one of the one or more modules is a zoom zoom axicon module 106 (as shown in FIG. 1), then one or more of the lenses of zoom zoom axicon module 106 may be moved in up to six degrees of freedom. If one of the one or more modules is a condenser module 108 or a multi field relay module 110 using two or more mirrors for telecentricity correction, then one or more of the mirrors may be moved in up to six degrees of freedom. If one of the one or more modules is a condenser module 108 or a multi field relay module 110 using one or more lenses for telecentricity correction, then one or more of the lenses may be moved in up to six degrees of freedom.

Figure 8:
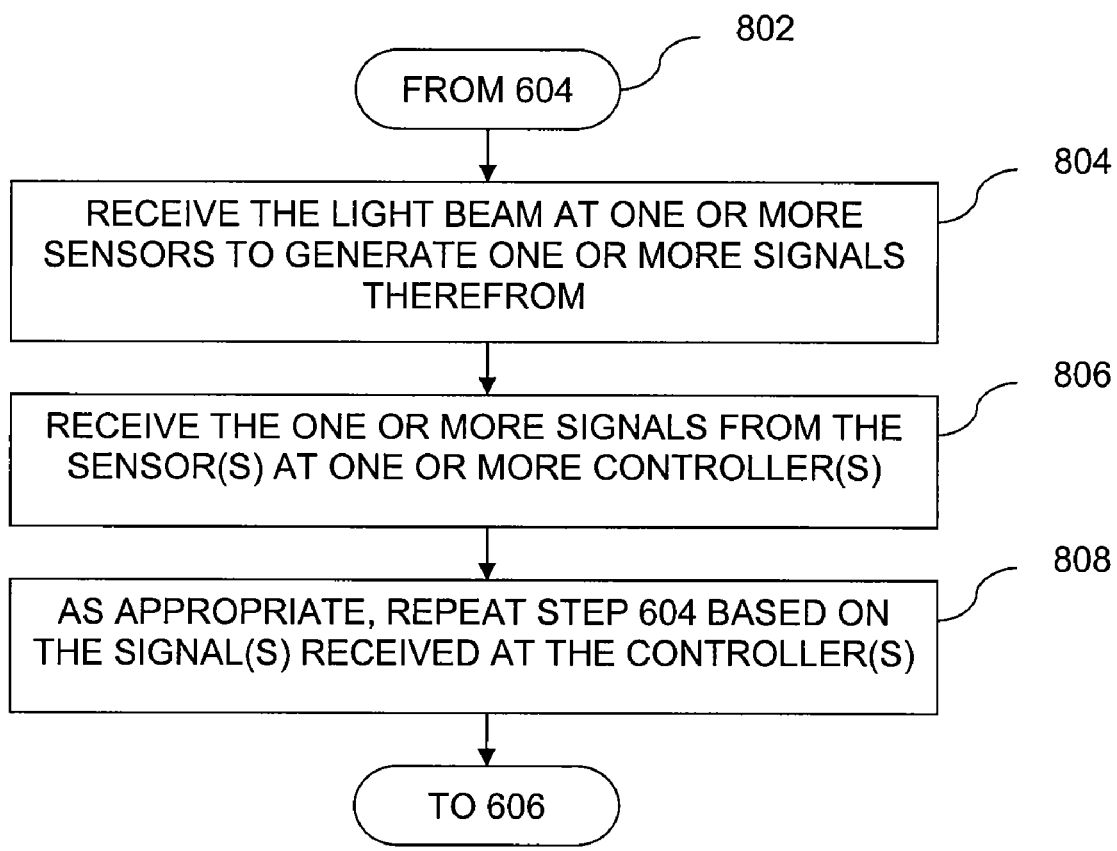
FIG. 8 is a flowchart depicting further steps of the method shown in FIG. 6, according to an embodiment of the present invention.

FIG. 8 is a flowchart depicting further steps 800 of the method 600 shown in FIG. 6, according to an embodiment of the present invention. The steps of method 800 of FIG. 8 represent the use of a control system, such as that shown in FIG. 4. Method 800 begins at step 802, which may proceed from step 604 of method 600. In step 804, the light beam is received by one or more sensors (e.g., sensor(s) 446) from various locations within the illumination system to generate one or more signals therefrom. In step 806, the one or more signals (e.g., signal(s) 448) are received from the one or more sensors at one or more controllers (e.g., controller(s) 450) that are coupled to the optical elements of the one or more modules. In step 808, step 604 is repeated, as appropriate, based on the one or more signals received at the one more controllers. In step 810, method 800 proceeds to step 606 of method 600 and ends.

In order to adjust optical elements in accordance with one or more embodiments of the present invention, actuators or mechatronics may be used. FIGS. 9A/B through 13 depict examples of mountings and actuators that may be used with the above-described embodiments.

FIGS. 9A and 9B depict an example lens mounting 970 (A/B) that includes actuators 975 for adjusting lens position, which may be used in accordance with embodiments described above involving movable lenses (e.g., movable lenses 112, 114, and 314 in FIGS. 1 and 3). Lens mountings 970, shown within their available volumes 971, each include a lens mounting area 972. Lens mounting area 972 may be designed using multiple flexures 973. The flexures 973B shown in FIG. 11B are shown as double cut flexures. However, other types of flexures may be used. Flexures 973 support the lens and are flexible for lens adjustment. Lens mountings 970 may each include cap gauges 974 to measure lens position. Cap gauges 974 may be linear encoders.

Lens mountings 970 also include actuators 975. Actuators 975 may include voice coil actuators, for example. However, other types of actuators may be used. Actuators 975, as shown in this example, may be used to position the lens in two degrees of freedom (X and Y). The structure of lens mountings 970, the actuators 975, and the flexures 973 act to support and constrain the motion of the lens in various directions. The motion of the lens may be controlled within certain specifications. As an example, the distance the lens may be moved in the X or Y direction may be controlled to be within about +/−150 μm, and its accuracy or resolution of position may be controlled to be less than about 0.25 μm. As would be understood by those skilled in the relevant art(s), the use of lens mountings 970 is not to be limited to lenses. Lens mountings 970 may also be used with other optical components.

In accordance with embodiments of the present invention, movable lenses, such as lenses 112, 114, and 314, may each be coupled to (e.g., placed into) a lens mounting 970 (A or B). Actuators 975 of each lens mounting 970 may move or adjust the position of the lens therein. In an embodiment, the adjustment of a lens may be done in response to an actuation signal received by actuator 975. An actuation signal (e.g., signals 452 and 454 in FIG. 4) may come from one or more controllers, such as controller(s) 450 in FIG. 4.

FIG. 10 depicts an example of a multi field relay module 1000 that may be used in accordance with embodiments of the present invention that involve movable mirrors, such as mirrors 116/118 in FIG. 1. A module similar to module 1000 may be used for a condenser module that uses mirrors, such as mirrors 216/218 in FIG. 2. In the example shown, module 1000 includes core optics 1086 that split an incoming beam into a plurality of beam segments 1015-1 through 1015-N. In addition. module 1000 includes an upper telecentricity correction mirror (TCM) assembly 1081 that includes one or more movable telecentricity correction mirrors 1016, each in its own mirror mounting 1082, and a lower telecentricity correction mirror (TCM) assembly 1083 that includes one or more movable telecentricity correction mirrors 1018, each in its own mirror mounting 1084. In this example, mirrors 1016 and 1018 may move in two degrees of freedom. Module 1000 may also include core optics 1086 that include one or more reflective, refractive, and/or diffractive optical elements. In the example shown, the optical elements of core optics 1086 may move in three degrees of freedom. In this example, the mirrors of TCM assemblies 1082 and 1084 may be adjusted to correct telecentricity. It is also possible for optical elements of core optics 1086 to have the capability of correcting telecentricity. Module 1000 may also include a shutter assembly 1088 with one or more shutters that may independently block a beam of light if desired.

FIGS. 11, 12, and 13 each depict a mirror mounting example that may include actuators for adjusting mirror position, which may be used in accordance with embodiments of the present invention.

FIG. 11 depicts a mirror mounting 1182 for mirror 1116 of an upper TCM assembly 1081 (FIG. 12) or mirror 1118 of a lower TCM assembly 1083 (FIG. 12). Mirror mounting 1182 includes an encoder 1190, encoder scale 1192, actuator 1194, and flexures 1196. Flexures 1196 are used to control the range of motion of the mirror. Flexures 1196 support mirror 1116/1118 and are flexible for mirror adjustment. The structure of mirror mounting 1182, actuator 1194, and flexures 1196 act to support and constrain the motion of the mirror in various directions. The motion of the mirror may be controlled within certain specifications. Actuator 1194 may move or adjust the position of mirror 1116/1118. In an embodiment, the adjustment of mirror 1116/1118 may be done in response to an actuation signal received by actuator 1194. An actuation signal (e.g., signals 452 and 454) may come from one or more controllers, such as controller(s) 450, all shown in FIG. 4.

FIGS. 12 and 13 depict two more example mirror mountings 1282/1382. These examples show possible arrangements of mirrors 1216/1218 and 1316/1318 and corresponding flexures 1296/1396. These examples would also include one or more encoders and actuators having the same purpose as described above with respect to FIG. 11. However, the encoders and actuators are not shown in FIGS. 12 and 13 for simplicity.

The above-described illumination system with telecentricity correction may be used in optical systems, including lithography systems. Although specific reference has been made above in the context of optical lithography, it will be appreciated that the invention may be used in other applications as well. It is also to be appreciated that the above-described embodiments may be used in conventional mask-based lithography as well as maskless lithography. The invention may also be used for immersion lithography, interferometric lithography, or in other systems that include a similar functioning optical system. In addition, the invention may be used in EUV applications, but is not to be limited to EUV applications.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

The foregoing description of the specific embodiments will so fully reveal the general nature of the invention that others may, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

While various embodiments of the present invention have been described above, it should be understood that they have been presented by way of example only, and not limitation. It will be apparent to persons skilled in the relevant art that various changes in form and detail may be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An illuminator, comprising:
a plurality of mirrors configured to split a beam into a plurality of beam segments;
a plurality of first movable optical elements configured to correct telecentricity for the plurality of beam segments; and
a plurality of second movable optical elements configured to correct telecentricity for the plurality of beam segments,
wherein the plurality of second movable optical elements is configured to direct the corrected plurality of beam segments to a patterning device.

2. The illuminator of claim 1, wherein the plurality of the first or second movable optical elements comprise aspheric surfaces.

3. The illuminator of claim 1, further comprising a zoom zoom axicon capable of telecentricity correction over an entire zoom range.

4. The illuminator of claim 3, wherein one or more movable optical elements of the zoom zoom axicon comprises one or more lenses that are configured to be adjusted in up to six degrees of freedom.

5. The illuminator of claim 1, further comprising a condenser.

6. The illuminator of claim 5, wherein one or more movable optical elements of the condenser comprises one or more telecentricity correction lenses that are configured to be adjusted in up to six degrees of freedom.

7. The illuminator of claim 5, wherein one or more movable optical elements of the condenser comprises two or more telecentricity correction mirrors such that one or more of the two or more telecentricity correction mirrors are configured to be adjusted in up to six degrees of freedom.

8. The illuminator of claim 1, further comprising a shutter assembly configured to independently block one or more of the plurality of beam segments.

9. The illuminator of claim 1, wherein the plurality of first and second movable optical elements comprise a telecentricity correction mirror such that the telecentricity correction mirror is configured to be adjusted in up to six degrees of freedom.

10. The illuminator of claim 1, wherein the plurality of first and second movable optical elements comprise a telecentricity correction lens that is configured to be adjusted in up to six degrees of freedom.

11. The illuminator of claim 1, further comprising a control system that is configured to control a positioning of one or more of the plurality of first and second movable optical elements to maintain low telecentricity error.

12. The illuminator of claim 11, wherein the control system comprises:
    a sensor configured to receive a beam segment ; and
    a controller, coupled to the sensor, configured to control the positioning of the one or more of the plurality of first and second movable optical elements based on signals received from the sensor.

13. A lithography system, comprising:
    a source of radiation configured to emit a beam of radiation;
    an illuminator configured to process the beam of radiation, the illuminator comprising,
        a plurality of mirrors configured to split the beam of radiation into a plurality of beam segments;
        a plurality of first movable optical elements configured to correct telecentricity for the plurality of beam segments;
        a plurality of second movable optical elements configured to correct telecentricity for the plurality of beam segments, wherein the plurality of second movable optical elements is configured to direct the corrected plurality of beam segments to a patterning device;
    the patterning device configured to pattern the processed beam segments ; and
    a projection system configured to project the patterned beam segments onto a target portion of a substrate.

14. The lithography system of claim 13, further comprising a beam delivery system configured to receive the beam of radiation from the source of radiation and direct the beam of radiation to the illuminator.

15. The lithography system of claim 13, further comprising a control system that is configured to control a positioning of one or more of the plurality of first and second movable optical elements to maintain low telecentricity error.

16. A method of providing illumination with low telecentricity error, comprising:
    splitting a light beam into a plurality of beam segments;
    adjusting positions of respective optical elements of a plurality of first movable optical elements and a plurality of second movable optical elements to correct telecentricity for the plurality of beam segments before directing the beam segments out of an illumination system to a patterning device.

17. The method of claim 16, wherein the adjusting step includes moving the respective optical elements in up to six degrees of freedom.

18. The method of claim 16, further comprising:
    receiving the light beam at a sensor to generate a signal therefrom;
    receiving the signal from the sensor at a controller; and
    as appropriate, repeating the adjusting step based on the signal received at the controller.

19. The method of claim 16, wherein the adjusting step occurs during setup of a lithographic operation.

20. The method of claim 16, wherein the adjusting step occurs periodically during a lithographic operation.

21. The method of claim 16, wherein the adjusting step occurs continuously during a lithographic operation.

22. A beam control system for lithographic processing, the beam control system comprising:
    a plurality of optical elements disposed in an optical path of a light beam configured to split the light beam into a plurality of beam segments;
    a plurality of first optical elements and a plurality of second optical elements configured to correct telecentricity for the plurality of beam segments prior to the beam segments being directed to a patterning device; and
    one or more sets of one or more corresponding actuators coupled to the plurality of first and second optical elements, wherein the one or more corresponding actuators is configured to reposition respective ones of the plurality of first and second optical elements in response to one or more corresponding actuation signals,
    wherein the one or more corresponding actuators arc used to adjust positions of the plurality of first and second optical elements to maintain low telecentricity error.

23. The beam control system of claim 22, further comprising:
    a controller coupled to the one or more sets of one or more corresponding actuators to provide the one or more corresponding actuation signals.

24. The beam control system of claim 23, further comprising:
    one or more sensors corresponding to the plurality of first and second optical elements, the one or more sensors coupled to the controller and configured to detect positioning of one or more of the plurality of beam segments leaving the plurality of first and second optical elements.

25. The beam control system of claim 24, further comprising:
    a feedback loop coupled to the one or more sensors and configured to control repositioning of at least one of the plurality of first and second optical elements based on one or more sensor signals, for correcting teleccntricity errors during the lithographic processing.

* * * * *